(12) United States Patent
Agrawal et al.

(10) Patent No.: US 8,558,597 B2
(45) Date of Patent: Oct. 15, 2013

(54) HIGH-RESOLUTION PHASE INTERPOLATORS

(75) Inventors: Ankur Agrawal, White Plains, NY (US); John F. Bulzacchelli, Yonkers, NY (US); Sergey V. Rylov, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/538,621

(22) Filed: Jun. 29, 2012

(65) Prior Publication Data

US 2013/0207708 A1  Aug. 15, 2013

Related U.S. Application Data

(63) Continuation of application No. 13/538,276, filed on Jun. 29, 2012.

(60) Provisional application No. 61/597,491, filed on Feb. 10, 2012.

(51) Int. Cl.
*H03H 11/16* (2006.01)

(52) U.S. Cl.
USPC .......................................... 327/231; 327/237

(58) Field of Classification Search
None
See application file for complete search history.

(56) References Cited

U.S. PATENT DOCUMENTS

| | | | |
|---|---|---|---|
| 5,579,004 A * | 11/1996 | Linz | 341/144 |
| 6,900,681 B2 | 5/2005 | Takano | |
| 7,034,592 B2 * | 4/2006 | Saeki | 327/163 |
| 7,088,270 B1 | 8/2006 | Dally et al. | |
| 7,409,021 B2 | 8/2008 | Glenn | |
| 7,423,469 B2 | 9/2008 | Pickering et al. | |
| 7,443,219 B2 | 10/2008 | Rausch | |
| 7,477,714 B2 | 1/2009 | Dietl et al. | |
| 7,514,991 B2 | 4/2009 | Schnarr | |
| 7,681,063 B2 | 3/2010 | Partovi et al. | |
| 7,825,710 B2 * | 11/2010 | Kim et al. | 327/158 |
| 2007/0149142 A1 | 6/2007 | Law et al. | |
| 2010/0134152 A1 | 6/2010 | Benyahia et al. | |

OTHER PUBLICATIONS

L. Yang et al., "A Single-Stage Direct Interpolation Multiphase Clock Generator," Analog Integrated Circuits and Signal Processing, Jan. 2004, pp. 17-22, vol. 38, No. 1.

* cited by examiner

*Primary Examiner* — Cassandra Cox
(74) *Attorney, Agent, or Firm* — Anne V. Dougherty; Ryan, Mason & Lewis, LLP

(57) ABSTRACT

A phase interpolator circuit is provided that generates an output clock signal by interpolating between phases of first and second clock signals. Interpolation is performed by detecting an edge of the first clock signal and applying a first current to charge a capacitance of an output node to a voltage level which is less than or equal to a switching threshold of a voltage comparator, and detecting an edge of the second clock signal and applying a second current to charge the capacitance of the output node to a voltage level which exceeds the switching threshold of the voltage comparator. The magnitude of the first current is varied to adjust a timing at which the capacitance of the output node is charged to a voltage level that exceeds the switching threshold of the voltage comparator and to adjust a phase of the output clock signal output from the voltage comparator.

15 Claims, 12 Drawing Sheets

300

700

800

900

HIGH-RESOLUTION PHASE INTERPOLATORS

CROSS-REFERENCE TO RELATED APPLICATION

This application is a Continuation of U.S. patent application Ser. No. 13/538,276, filed on Jun. 29, 2012, which claims priority to U.S. Provisional Patent Application Ser. No. 61/597,491, filed on Feb. 10, 2012, the disclosures of which are incorporated herein by reference.

TECHNICAL FIELD

The field relates generally to circuits and methods for generating clock signals, and in particular, circuits and methods for generating clocks signals using high-resolution phase interpolator architectures for digital and mixed signal systems.

BACKGROUND

Clock signal generation is a critical function in many digital and mixed-signal circuits as achieving high performance in such systems often requires a clock with precise phase position. Examples of such systems are phase-locked loops and delay-locked loops, clock and data recovery circuits, time-interleaved analog to digital converters (ADCs) etc. Phase interpolators are often used to generate an output clock with an adjustable phase from two input clock signals. Phase interpolators typically use digital control bits to determine the phase of the output clock that is a weighted sum of the phases of the two input clocks.

Traditionally, interpolators with high phase resolution have been implemented using current mode logic (CML) circuits. In particular, with a standard CML-type interpolator, two input clocks are first pre-conditioned using a slew-rate limiting circuit, and then input to an interpolator core that interpolates the phases of the two slew-rate limited input clock signals. The interpolation between the two slew-rate limited input clock phases is determined by the relative magnitudes of tail currents of the CML circuit, which can be set with current-mode digital to analog converters (DACs). High phase resolution in the interpolation can be achieved in a straightforward manner by employing high-resolution DACs.

A CML phase interpolator is a convenient choice when clock signals in the system are distributed with CML levels. In more recent systems, such as high-speed I/O macros, CMOS (rail-to-rail) clock distribution is employed instead of CML clock distribution, to improve power efficiency. In this case, the use of CML phase interpolators necessitates CMOS-to-CML converters in front of the interpolator, and CML-to-CMOS converters in back of the interpolator. Furthermore, pre-conditioning slew-rate-limiters may also be used to maintain good linearity in the interpolation. The complexity of all these additional circuits increases the circuit costs (e.g., chip area, power), reducing the attractiveness of a CML phase interpolator solution.

For these reasons, it is desirable to have a phase interpolator that directly operates on and produces CMOS rail-to-rail clock signals. A simple CMOS phase interpolator can be implemented by dotting together the outputs of a plurality of CMOS inverters driven by different clock phases. In this circuit implementation, two input clock phases are fed to multiple tri-state inverters of varying strengths, which are turned on or off using n-bit control words. The sum of these control words can be held constant, wherein the output clock phase depends on the relative values of these control words.

Typically, the interpolation linearity achieved with a CMOS interpolator is not as good as the interpolation linearity achieved with a CML phase interpolator, especially if the input phases are relatively widely spaced, such as 90 degrees or more. Furthermore, it is difficult to achieve high phase resolution with CMOS interpolators. Indeed, since the area and power considerations usually limit the number of inverters that can be switched in, the quantization of the resulting interpolation is relatively coarse.

SUMMARY

Exemplary embodiments of the invention generally include circuits and methods for generating clock signals, and in particular, circuits and methods for generating clocks signals using high-resolution phase interpolator techniques for digital and mixed signal systems. Exemplary embodiments of the invention provide phase interpolation circuits and methods that can directly operate on and generate CMOS rail-to-rail clock signals.

In one exemplary embodiment of the invention, a phase interpolator circuit includes an interpolator core that generates an output clock signal by interpolating between a phase of a first input clock signal and a phase of a second input clock signal, wherein the phase of the first input clock signal is earlier than the phase of the second input clock signal. The interpolator core performs interpolation by detecting an arrival of an edge of the first input clock signal and in response to the detecting, by switchably connecting a first current source to an output node to apply a first current that charges a capacitance of the output node to a voltage level which is less than or equal to a switching threshold of a voltage comparator circuit. The interpolator core further performs interpolation by detecting an arrival of an edge of the second input clock signal and in response to the detecting, by switchably connecting a second current source to the output node to apply a second current that charges the capacitance of the output node to a voltage level which exceeds the switching threshold of the voltage comparator circuit. The phase interpolator circuit further includes a controller that controls the first current source to generate a first current having a variable magnitude that is selected to adjust a timing at which the capacitance at the output node is charged to a voltage level that exceeds the switching threshold of the voltage comparator circuit and thereby adjust a phase shift of the output clock signal output from the voltage comparator circuit.

In another exemplary embodiment of the invention, a phase interpolator circuit includes a first power supply node, a second power supply node, a first output node and a second output node, a voltage comparator circuit, a first current source, a second current source, a first switch circuit, a second switch circuit, a third switch circuit, and a controller. The voltage comparator circuit has a first input terminal connected to the first output node and an output terminal connected to the second output node. The first current source and the second current source are both connected to the first power supply node. The first current to source generates a first current and the second current source generates a second current. The first switch circuit is connected between the first current source and the first output node, wherein the first switch circuit is controlled to switchably apply the first current to the first output node and charge a capacitance of the first output node during an interpolation period. The second switch circuit is connected between the second current source and the first output node, wherein the second switch circuit is controlled to switchably apply the second current to the first output node and charge the capacitance of the first output node during the interpolation period. The third switch circuit is connected between the first output node and the second power supply node, wherein the third switch circuit is controlled during a reset period to switchably connect the first output node to the second power supply node and reset a voltage level of the first output node to a voltage level of the second power supply node. The controller controls the first current source to generate a first current having a variable magnitude that is selected to adjust a timing at which the capacitance of the first output node is charged to a voltage level that exceeds a switching threshold of the voltage comparator circuit and thereby adjust a phase shift of an output clock signal output from the voltage comparator circuit.

In yet another exemplary embodiment of the invention, a phase interpolator circuit includes a first interpolation stage and a second interpolation stage. The first interpolation stage includes a first interpolator circuit and a second interpolator circuit. The first and second interpolator circuits each receive as input a first input clock signal and a second input clock signal, wherein the first input clock signal has a phase that is earlier than a phase of the second input clock signal. The first interpolator circuit generates a first output clock signal by interpolating between the phases of the first and second input clock signals, and the second interpolator circuit generates a second output clock signal by interpolating between the phases of the first and second input clock signals. The second interpolation stage receives as input the first and second output clock signals output from the first interpolation stage, and generates a third output clock signal by interpolating between phases of the first and second output clock signals.

In another exemplary embodiment of the invention, a method is provided for generating a clock signal by interpolating between a phase of a first input clock signal and a phase of a second input clock signal, wherein the phase of the first input clock signal is earlier than the phase of the second input clock signal. The method includes detecting an arrival of an edge of the first input clock signal; in response to said detecting, switchably connecting a first current source to an output node to apply a first current to the output node and charge a capacitance of the output node, using only the first current, to a voltage level which is less than or equal to a switching threshold of a voltage comparator circuit; detecting an arrival of an edge of the second input clock signal; in response to said detecting, switchably connecting a second current source to the output node to apply a second current to the output node and charge the capacitance of the output node to a voltage level which exceeds the switching threshold of the voltage comparator circuit; and controlling the first current source to generate a first current having a variable magnitude that is selected to adjust a timing at which the capacitance on the output node is charged to a voltage level that exceeds the switching threshold of the voltage comparator circuit and thereby adjust a phase shift of the output clock signal output from the voltage comparator circuit.

These and other exemplary embodiments of the invention will become apparent from the following detailed description of exemplary embodiments thereof, which is to be read in connection with the accompanying drawings.

DETAILED DESCRIPTION OF EXEMPLARY EMBODIMENTS

Exemplary embodiments will now be discussed in further detail with regard to circuits and methods for generating clock signals, and in particular, circuits and methods for generating clocks signals using high-resolution phase interpolator techniques for digital and mixed signal systems. Phase interpolation circuits and methods according to exemplary embodiments of the invention as described below are configured to directly operate on and generate CMOS rail-to-rail clock signals.

Figure 1:
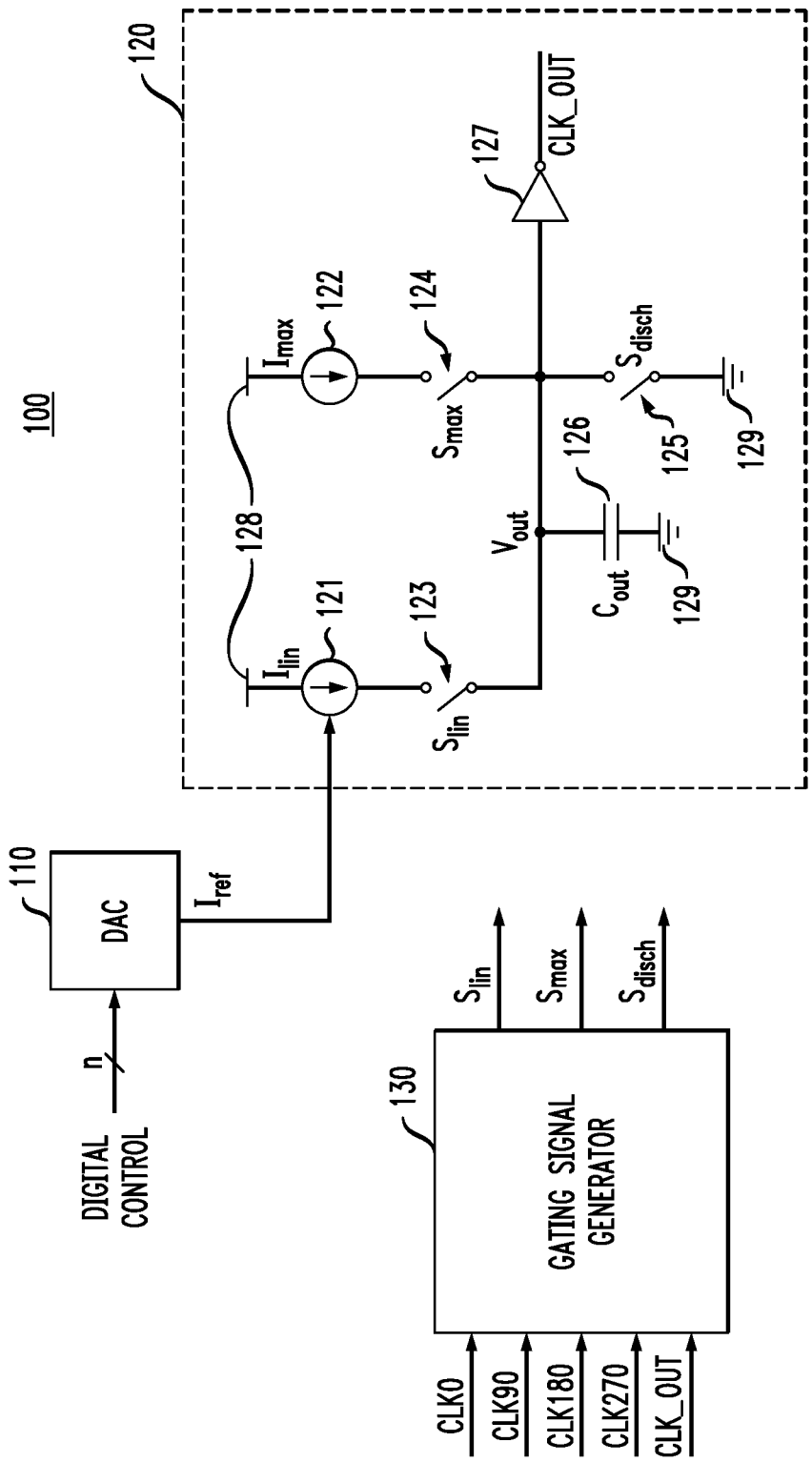
FIG. 1 is a schematic diagram of a phase interpolator circuit according to an exemplary embodiment of the invention.

For instance, FIG. 1 is a schematic diagram of a phase interpolator circuit according to an embodiment of the invention. In particular, as depicted in FIG. 1, a CMOS phase interpolator circuit 100 comprises a current mode DAC 110, an interpolating core 120, and a gating signal generator 130. The interpolating core 120 comprises a variable current source 121 that generates a variable charging current $I_{lin}$, a fixed current source 122 that generates a fixed charging current $1_{max}$, a first switch 123, a second switch 124, a third switch 125, an output capacitor 126 (with capacitance $C_{out}$), and an inverter 127. The current sources 121 and 122 are connected between a first power supply node 128 and respective switches 123 and 124. The switches 123, 124 and 125 are connected to an output node $V_{out}$ (first output node). The output capacitor 126 is connected between the output node $V_{out}$ and a second power supply node 129 (e.g., ground) and the third switch 125 is connected between the output node $V_{out}$ and the second power supply node 129. The inverter 127 has an input connected to the (first) output node $V_{out}$ and an output connected to a second output node (CLK_OUT) of the phase interpolator 100.

It is to be noted that in the exemplary embodiment of FIG. 1 (and other embodiments described below), the output capacitor 126 represents a discrete capacitance or a parasitic capacitance, or both. In particular, in one embodiment, the output capacitance $C_{out}$ at the output node $V_{out}$ can be implemented by using a discrete capacitor element that is physically connected between the output node and the second power supply node. In other embodiments, the output capacitance $C_{out}$ at the output node $V_{out}$ can be implemented by using a total of the parasitic capacitances present on the output node $V_{out}$ due to the various components (e.g., input to inverter 127) connected to the output node $V_{out}$. In other embodiments, the output capacitance $C_{out}$ at the output node $V_{out}$ can be implemented by relying on both a discrete capacitor and the total parasitic capacitance present on the output node $V_{out}$, assuming of course that the value of the total parasitic capacitance is essentially not negligible in view of the capacitance value of the discrete capacitor.

In the exemplary embodiment of FIG. 1 (and other embodiments described below), the DAC 110 and current sources 121 and 122 may be implemented using known techniques and circuit architectures. In general, the DAC 110 can be any circuit that generates a current $I_{REF}$ that serves as a reference current that is used by the variable current source 121 to generate a current $I_{lin}$ that is proportional to the reference current $I_{REF}$. The variable current source 121 may be a current mirror circuit that mirrors the reference current $I_{REF}$ and generates a current proportional (e.g., 1:1) to the reference current $I_{REF}$. Although the embodiment of FIG. 1 shows a DAC 110 to generate the reference current $I_{REF}$, the DAC 110 can be replaced with any suitable current control circuit (analog or digital) for generating reference currents and controlling the charging currents of variable current sources, without departing from the scope of the appended claims.

The gating signal generator 130 receives as input four quadrature clock input signals (CLK0, CLK90, CLK180, and CLK270) and optionally an output clock signal (CLK_OUT) output from the inverter 127, to produce three gating signals $S_{lin}$, $S_{max}$, $S_{disch}$. A first gating signal $S_{lin}$ controls the first switch 123, a second gating signal $S_{max}$ controls the second switch 124, and a third gating signal $S_{disch}$ controls the third switch 125. The gating signals control the charging and discharging of the output capacitor 126 in accordance with a sequence shown in the timing diagram of FIG. 2.

Figure 2:
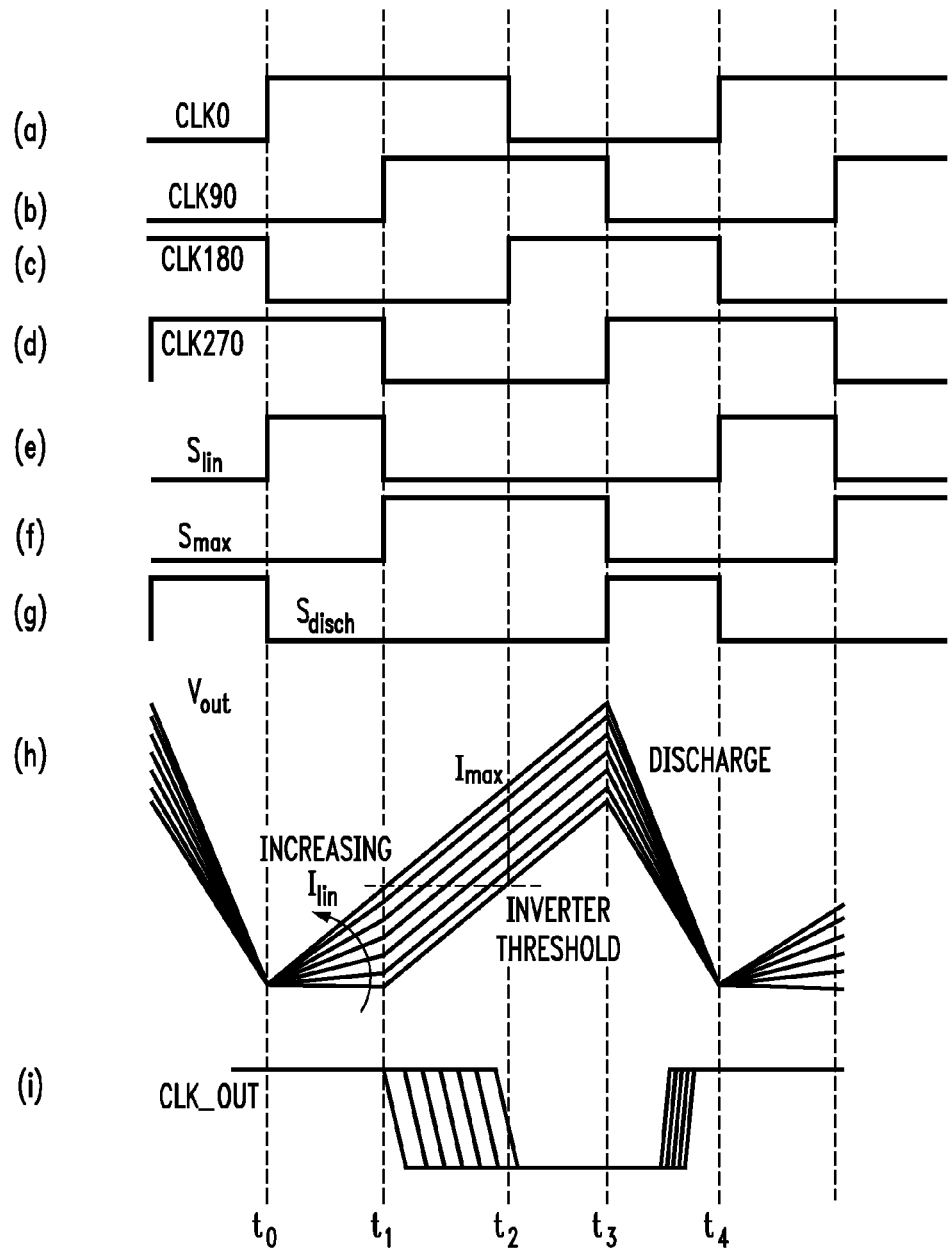
FIG. 2 is a timing diagram that illustrates a mode of operation of the phase interpolator circuit of FIG. 1, according to an exemplary embodiment of the invention.

More specifically, FIG. 2 shows example waveforms that illustrate an operating mode of the phase interpolator of FIG. 1. In FIG. 2, waveform (a) illustrates a first clock signal CLK0 input to the gating signal generator 130, waveform (b) illustrates a second clock signal CLK90 input to the gating signal generator 130, waveform (c) illustrates a third clock signal CLK180 input to the gating signal generator 130, waveform (d) illustrates a fourth clock signal CLK270 input to the gating signal generator 130, waveform (e) illustrates a first gating signal $S_{lin}$ that switchably controls the first switch 123, waveform (f) illustrates a second gating signal $S_{max}$ that switchably controls the second switch 124, waveform (g) illustrates a third gating signal $S_{disch}$ that switchably controls the third switch 125, waveform (h) illustrates different output voltage waveforms generated at the output node $V_{out}$ for different values of the variable current $I_{lin}$ generated by the variable current source 121, and waveform (i) illustrates different output clock CLK_OUT waveforms that are generated in response to the different values of the variable current $I_{lin}$.

As shown in FIG. 2, in a first quarter cycle (time period from $t_0$ to $t_1$), the first switch 123 is activated (closed) in response to a logic "high" gating signal $S_{lin}$, while the second and third switches 124 and 125 are deactivated (opened) in response to logic "low" gating signals $S_{max}$ and $S_{disch}$, respectively. As such, in the first quarter cycle, a variable charging current $I_{lin}$ generated by the first current source 121 is applied to charge the output capacitor 126, thereby creating a linearly varying output voltage on the output node $V_{out}$ at time $t_1$ that varies between 0 and $V_{mid}$, where $V_{mid}$ is a voltage level equal to or less than the switching threshold of the downstream inverter 127.

This voltage variation is then converted to a time variation in a next half-cycle when the output capacitor 126 is charged with a fixed current $I_{max}$. In particular, in the next half-cycle (time period from $t_1$ to $t_3$), the first switch 123 is deactivated (opened) in response to a logic "low" gating signal $S_{lin}$, while the second switch 124 is activated (closed) in response to logic "high" gating signal $S_{max}$ and the third switch 125 remains deactivated (opened) in response to a logic "low" gating signal $S_{disch}$. As such, in the period from $t_1$ to $t_3$, the fixed current $I_{max}$ generated by the second current source 122 is applied to charge the output capacitor 126, wherein the voltage on the output node $V_{out}$ crosses the inverter threshold with constant slope.

Next, in a final quarter cycle (time period from $t_3$ to $t_4$), the output capacitor 126 is discharged by deactivating (opening) the second switch 124, and activating (closing) the third switch 125. In particular, in the time period from $t_3$ to $t_4$, the first switch 123 remains deactivated (opened) in response to a logic "low" gating signal $S_{lin}$, while the second switch 124 is deactivated (opened) in response to logic "low" gating signal $S_{max}$ and the third switch 125 is activated (closed) in response to a logic "high" gating signal $S_{disch}$. As such, in the period from $t_3$ to $t_4$, neither the variable current $I_{lin}$ nor the fixed current $I_{max}$ is applied to the output capacitor 126. Instead, the node $V_{out}$ is switchably connected to the second power supply node 129 (e.g., ground in this exemplary embodiment) to discharge the capacitor 126 and reset the voltage on the output node $V_{out}$.

It is to be appreciated that resetting the voltage on the output node $V_{out}$ to the level of the second supply voltage (e.g., ground in the exemplary embodiment) in every clock cycle eliminates the need for circuitry to set the common-mode of $V_{out}$. Since the voltage swing of $V_{out}$ is close to rail-to-rail, standard, simple CMOS inverters can be employed to produce interpolated clock signals with sharp rising and falling transitions, wherein the output of the phase interpolator (i.e., output of inverter 127) is close to rail-to-rail as well. The switches 123, 124 and 125 are driven by CMOS rail-to-rail signals.

Moreover, the current mode DAC 110 is responsive to an n-bit digital control signal to control the variable current source 121 to generate a variable current $I_{lin}$, which varies between 0 and $I_{max}$. The waveform (h) in FIG. 2 shows the voltage on the output node $V_{out}$ for a range of values of $I_{lin}$ from 0 to $I_{max}$. As shown in waveform (h) of FIG. 2, when $I_{lin}$ is at its maximum value ($I_{max}$), $V_{out}$ crosses $V_{mid}$ at the instant (time $t_1$) when $S_{lin}$ is asserted logic "low" to deactivate (open) the first switch 123 and $S_{max}$ is asserted logic "high" to activate (close) the second switch 124. Thus, when $I_{lin}$ is at its maximum value ($I_{max}$), at time instant t1, the adjustable current source is switched off, and the fixed current $I_{max}$ is applied to charge the output capacitance, which drives the output voltage on node $V_{out}$ above the threshold of the CMOS inverter 127. This implies that the insertion delay of the interpolator 100 of FIG. 1 is at least one-quarter of the clock period.

As further shown in waveform (h) of FIG. 2, when $I_{lin}$ is zero, $V_{out}$ crosses $V_{mid}$ when CLK180 goes high (at time $t_2$). In other words, for cases where $I_{lin}$ is near 0, the variable voltage on the output node $V_{out}$ is near 0V (at the time $t_1$ when the fixed current L applied and the variable current $I_{lin}$ is disconnected), and there is a maximum delay in driving the output voltage on $V_{out}$ above the threshold of a CMOS inverter. For cases where $I_{lin}$ is raised above 0, the variable voltage on the output node $V_{out}$ (at time $t_1$) is above 0V and the time instant when $V_{out}$ crosses $V_{mid}$ is shifted earlier (at some earlier time less than $t_2$). The magnitude of the time-shift is directly proportional to $I_{lin}$. Thus, the phase interpolator 100 has a range equal to one-quarter of the clock period. The resolution of interpolation depends on the current resolution of $I_{lin}$. A high resolution phase interpolator can be realized if the DAC 110 has high resolution. The gating signal generator 130 may comprise combinational logic gates.

Figure 3:
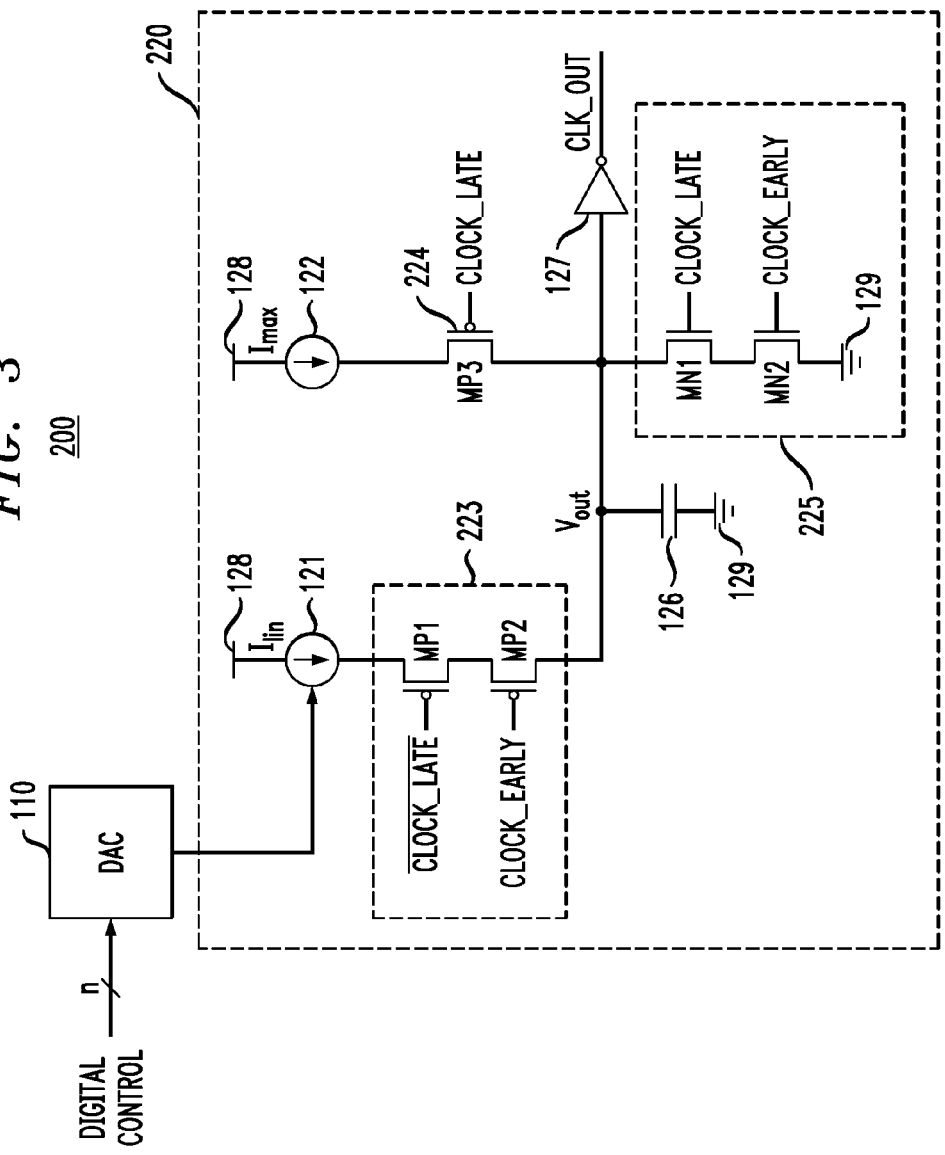
FIG. 3 is a schematic diagram of a phase interpolator circuit according to another exemplary embodiment of the invention.

FIG. 3 is a schematic diagram of a phase interpolator circuit according to another embodiment of the invention. In general, FIG. 3 shows a CMOS phase interpolator circuit 200 which is similar to that of FIG. 1, but where CMOS level clock signals directly drive an interpolator core. In particular, as depicted in FIG. 3, the CMOS phase interpolator circuit 200 comprises a current-mode DAC 110 and an interpolating core 220. The current mode DAC 110 is similar in function as described with reference to FIGS. 1 and 2. The interpolating core 220 comprises a variable current source 121 that generates a variable charging current $I_{lin}$, a fixed current source 122 that generates a fixed charging current $I_{max}$, a first switch circuit 223, a second switch circuit 224, a third switch circuit 225, an output capacitor 126 (with capacitance $C_{out}$), and an inverter 127. The current sources 121 and 122 are connected between a first power supply node 128 and respective switch circuits 223 and 224. The switch circuits 223, 224 and 225 are connected to an output node $V_{out}$ (first output node). The output capacitor 126 is connected between the output node $V_{out}$ and a second power supply node 129 (e.g., ground) and the third switch circuit 225 is connected between the output node $V_{out}$ and the second power supply node 129. The inverter 127 has an input connected to the (first) output node $V_{out}$ and an output connected to a second output node (CLK_OUT) of the phase interpolator 200.

The exemplary embodiment of FIG. 3 is similar in function to the exemplary embodiment of FIG. 1 except that in the embodiment of FIG. 3, gating logic is embedded within the interpolator core 220 wherein gating clocks (clock_early and clock_late) are directly applied to transistors within the switch circuits 223, 224 and 225 of the interpolator core 220. In particular, as shown in FIG. 3, the first switch circuit 223 comprises serially connected PMOS transistors MP1 and MP2, the second switch circuit 224 comprises PMOS transistor MP3, and the third switch circuit 225 comprises serially connected NMOS transistors MN1 and MN2. The clock_late signal is applied to gate terminals of transistors MP3 and MN1 of the switch circuits 224 and 225, respectively. A $\overline{\text{clock\_late}}$ (complement of the clock_late signal) is applied to a gate terminal of transistor MP1 of the first switch circuit 223. The clock_early signal is applied to gate terminals of transistors MP2 and MN2 of the switch circuits 223 and 225, respectively.

Figure 4:
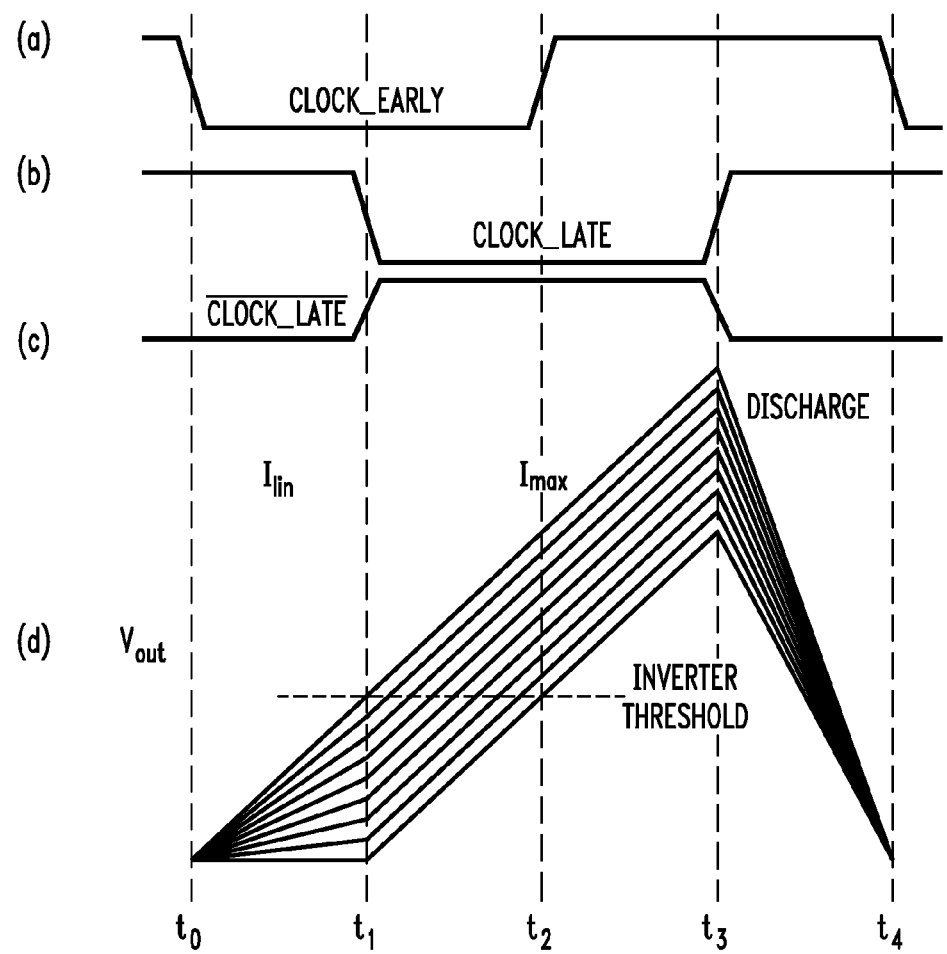
FIG. 4 is a timing diagram that illustrates a mode of operation of the phase interpolator circuit of FIG. 3, according to an exemplary embodiment of the invention.

The clock_early and $\overline{\text{clock\_late}}$ signals applied to transistors MP2 and MP1 of the first switch circuit 223 implicitly generate a control signal similar to the gating signal $S_{11}$, of FIG. 1 to switchably apply the linearly controlled current $I_{lin}$ to charge the output capacitor 126. Similarly, the clock_early and clock_late signals applied to transistors MN2 and MN1 implicitly generate a control signal similar to the gating signal $S_{disch}$ of FIG. 1 to switchably connect the output voltage node $V_{out}$ to the second power supply node (e.g., ground) to discharge the output capacitor 126 and reset the voltage on the output node $V_{out}$ to "ground" level. The clock_late signal applied to transistor MP3 of the second switch circuit 224 functions as the gate control signal $S_{max}$ of FIG. 1 to switchably apply the fixed maximum current $I_{max}$ to charge the output capacitor 126. The clock_early and clock_late and $\overline{\text{clock\_late}}$ signals control the charging and discharging of the output capacitor 126 in accordance with a sequence shown in the timing diagram of FIG. 4. More specifically, FIG. 4 shows example waveforms that illustrate an operating mode of the phase interpolator of FIG. 3. In FIG. 4, waveform (a) illustrates a clock_early signal, waveform (b) illustrates a clock_late signal, waveform (c) illustrates a $\overline{\text{clock\_late}}$ signal and waveform (d) illustrates different output voltage waveforms generated at the output node Vout for different values of the variable current $I_{lin}$ generated by the variable current source 121. As shown in FIG. 4, the clock_early signal is 90 degrees ahead of the $\overline{\text{clock\_late}}$ signal.

As shown in FIG. 4, in a first quarter cycle (time period from $t_0$ to $t_1$), the transistors MP1 and MP2 of the first switch circuit 223 are turned on (activated) in response to respective logic "low" $\overline{\text{clock\_late}}$ and clock_early signals, while transistor MP3 of the second switch circuit 224 is turned off (deactivated) in response to a logic "high" clock_late signal, and the third switch circuit 225 is effectively turned off since the transistor MN2 of the third switch circuit 225 is turned off (deactivated) in response to respective logic "low" clock_early signal. As such, in the first quarter cycle, a variable charging current $I_{lin}$ generated by the first current source 121 is applied to charge the output capacitor 126, thereby creating a linearly varying output voltage on the output node $V_{out}$ at time $t_1$ that varies between 0 and $V_{mid}$, where $V_{mid}$ is a voltage level equal to or less than the switching threshold of the downstream inverter 127.

This voltage variation is then converted to a time variation in a next half-cycle (time period from $t_1$ to $t_3$) when the output capacitor 126 is charged with a fixed current $I_{max}$. In particular, during the next half-cycle (time period from $t_1$ to $t_3$), the first switch circuit 223 is effectively deactivated (open) since the transistor MP1 of the first switch circuit 223 is turned off (deactivated) in response to a logic "high" $\overline{\text{clock\_late}}$ signal, while transistor MP3 of the second switch circuit 224 is turned on (activated) in response to a logic "low" clock_late signal, and the third switch circuit 225 is effectively turned off since transistor MN1 is turned off (deactivated) in response to the clock_late signal being set at a logic "low" level during the time period from $t_1$ to $t_3$. As such, in the period from $t_1$ to $t_3$, the fixed current $I_{max}$ generated by the second current source 122 is applied to charge the output capacitor 126, wherein $V_{out}$ crosses the inverter threshold with constant slope.

Next, in a final quarter cycle (time period from $t_3$ to $t_4$), the output capacitor 126 is discharged by maintaining the first switch circuit 223 deactivated (MP2 is turned off), by deactivating (opening) the second switch circuit 224 (MP3 is turned off), and by activating (closing) the third switch circuit 225 (both MN1 and MN2 are activated). In particular, in the time period from $t_3$ to $t_4$, the first switch circuit 223 remains deactivated (opened) as transistor MP2 of the first switch circuit 223 is turned off (deactivated) in response to a logic "high" clock_early signal. Moreover, transistor MP3 of the second switch circuit 224 is turned off (deactivated) in response to a logic "high" clock_late signal, and transistors MN1 and MN2 of the third switch circuit 225 are turned on (activated) in response to respective clock_late and clock_early signals being maintained/asserted at a logic "high" level. As such, in the period from $t_3$ to $t_4$, neither the variable current $I_{lin}$ nor the fixed current $I_{max}$ is applied to the output node $V_{out}$. Instead, the output node $V_{out}$ is switchably connected to the second power supply node 129 (e.g., ground in this exemplary embodiment) to discharge the output capacitor 126 (more generally, discharge the output capacitance $C_{out}$ on node $V_{out}$) and reset the voltage on the output node $V_{out}$ to a voltage level of the second power supply node in preparation for the arrival of the next falling edge of the clock_early signal. As with the exemplary embodiment of FIG. 1, the phase resolution of the interpolator 200 of FIG. 3 is set by the current resolution of the DAC 110.

Figure 5:
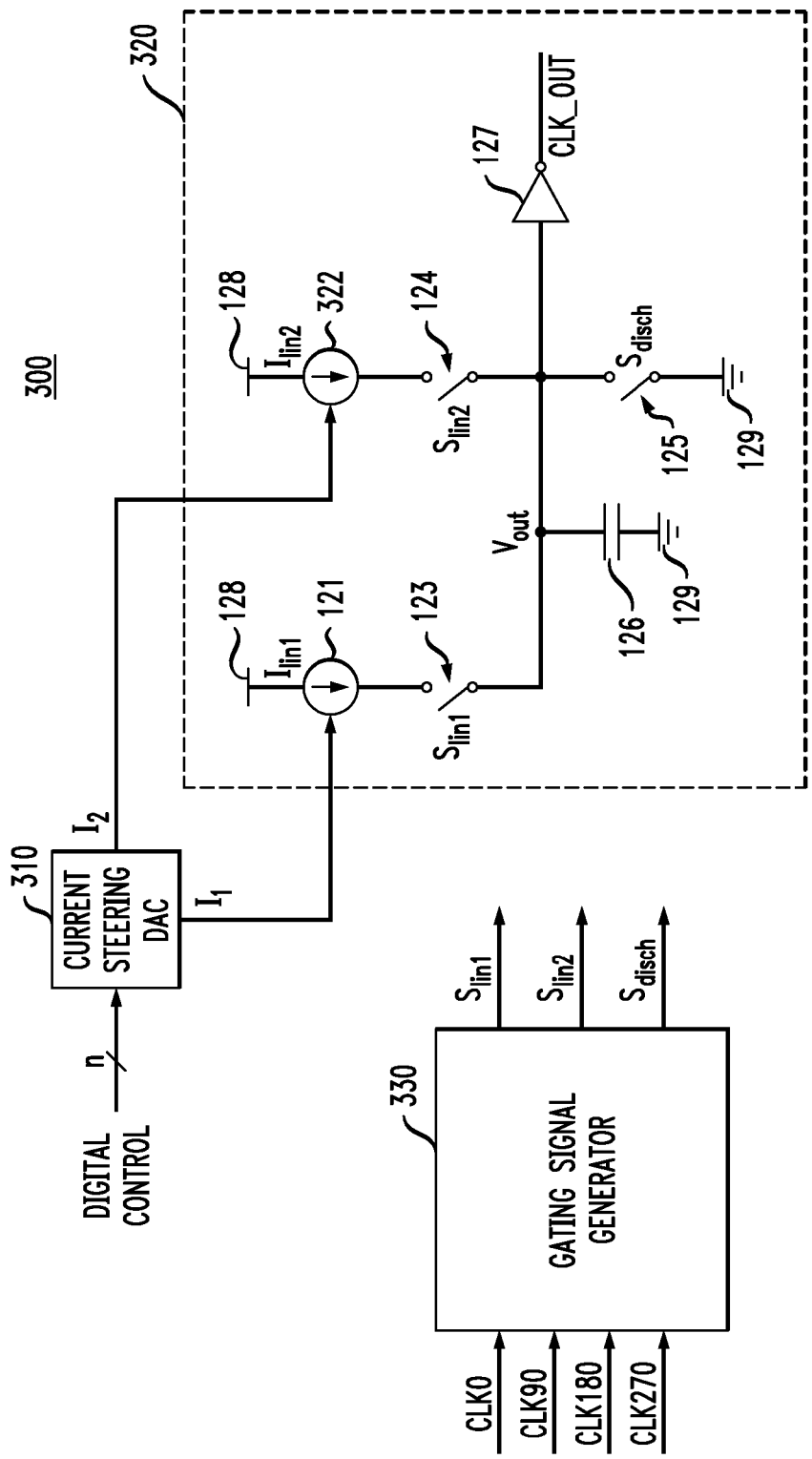
FIG. 5 is a schematic diagram of a phase interpolator circuit according to another exemplary embodiment of the invention.

FIG. 5 is a schematic diagram of a phase interpolator circuit according to another embodiment of the invention. In general, FIG. 5 shows a CMOS phase interpolator circuit 300 which is similar to that of FIG. 1, but where a current steering DAC generates bias currents for each of a plurality of charging branches of the phase interpolator. In particular, as depicted in FIG. 5, the CMOS phase interpolator circuit 300 comprises a current-steering DAC 310, an interpolating core 320 and a gating signal generator 330. The interpolating core 320 comprises a first variable current source 121 that generates a first variable charging current a second variable current source 322 that generates a second variable charging current $I_{lin2}$, a first switch 123, a second switch 124, a third switch 125, an output capacitor 126 (with capacitance $C_{out}$), and an inverter 127. The current sources 121 and 322 are connected between a first power supply node 128 and respective switches 123 and 124. The switches 123, 124 and 125 are connected to an output node $V_{out}$ (first output node). The output capacitor 126 is connected between the output node $V_{out}$ and a second power supply node 129 (e.g., ground) and the third switch 125 is connected between the output node $V_{out}$ and the second power supply node 129. The inverter 127 has an input connected to the (first) output node $V_{out}$ and an output connected to a second output node (CLK_OUT) of the phase interpolator 300.

In the exemplary embodiment of FIG. 5, the interpolator core 320 is similar to the interpolator core 120 of FIG. 1 except that the second current source 122 (in FIG. 1) which generates a fixed current $I_{max}$ is replaced by the second variable current source 322. In the embodiment of FIG. 5, the current steering DAC 310 generates control signals $I_1$ and $I_2$ (reference currents) to control the variable current sources 121 and 322 that generate currents $I_{lin1}$ and $I_{lin2}$ for each charging branch of the interpolator core 320. Depending on the value of an n-bit digital control word input to the current steering DAC 310, the current steering DAC 310 routes its internal current sources to either of its output current branches, wherein for all codes, the sum of $I_1+I_2$ is equal to some constant, $I_{sum}$. In one exemplary embodiment, the variable current sources 121 and 322 are current mirror circuits that mirror the reference currents $I_1$ and $I_2$, respectively, to generate respective currents $I_{lin}$ and $I_{lin2}$ which are proportional (e.g., 1:1) to the reference currents $I_1$ and $I_2$. When the currents $I_{lin1}$ and $I_{lin2}$ are 1:1 proportional to the reference currents $I_1$ and $I_2$, $I_{sum}$ is chosen to equal $I_{max}$.

The gating signal generator 330 receives as input four quadrature clock input signals (CLK0, CLK90, CLK180 and CLK270) to produce three gating signals $S_{lin1}$, $S_{lin2}$, $S_{disch}$. A first gating signal $S_{lin1}$ controls the first switch 123, a second gating signal $S_{lin2}$ controls the second switch 124, and a third gating signal $S_{disch}$ controls the third switch 125. The gating signals control the charging and discharging of the output capacitor 126 in accordance with a sequence shown in the timing diagram of FIG. 6.

Figure 6:
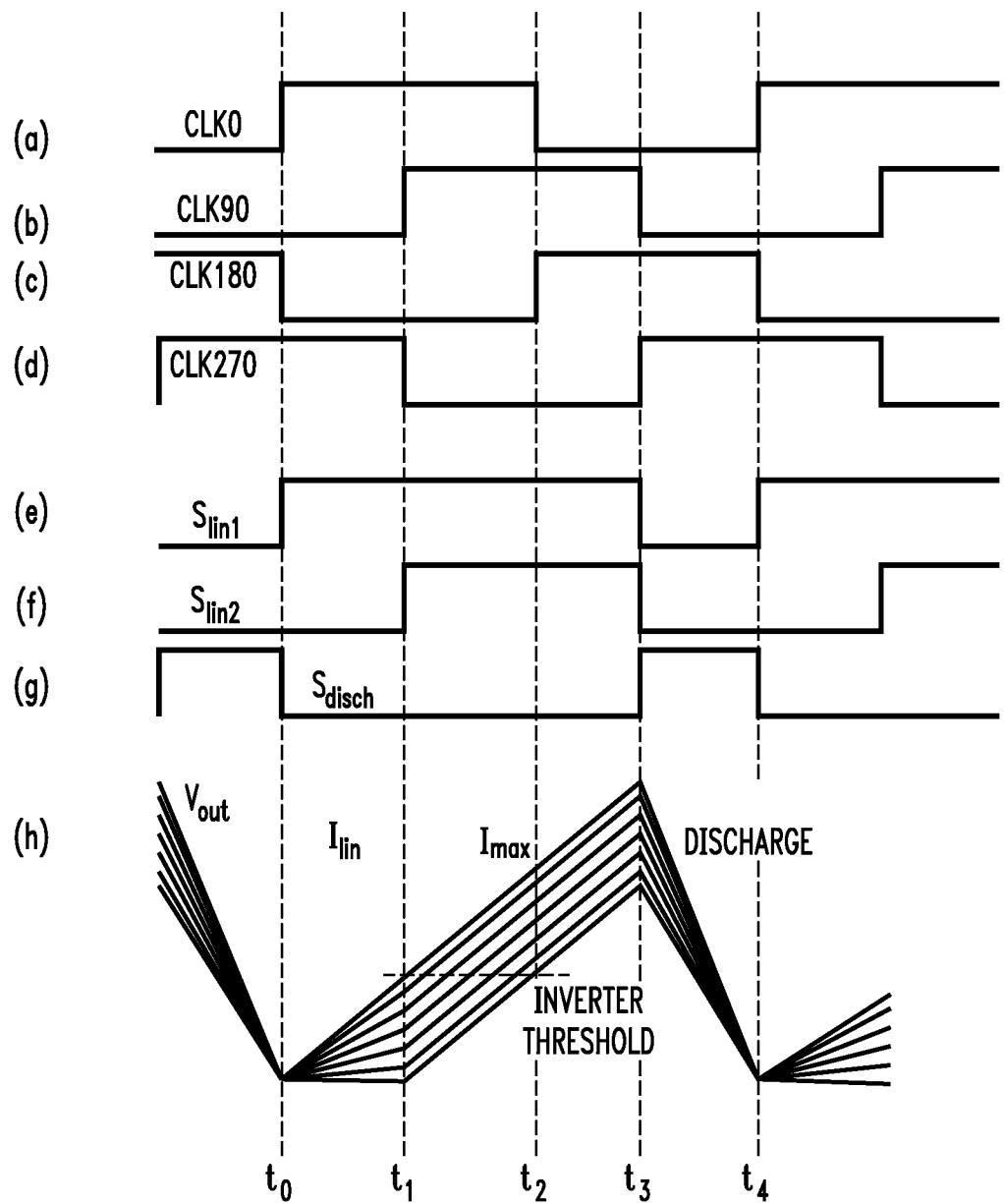
FIG. 6 is a timing diagram that illustrates a mode of operation of the phase interpolator circuit of FIG. 5, according to an exemplary embodiment of the invention.

More specifically, FIG. 6 shows example waveforms that illustrate an operating mode of the phase interpolator of FIG. 5. In FIG. 6, waveform (a) illustrates a first clock signal CLK0 input to the gating signal generator 330, waveform (b) illustrates a second clock signal CLK90 input to the gating signal generator 330, waveform (c) illustrates a third clock signal CLK180 input to the gating signal generator 330, waveform (d) illustrates a fourth clock signal CLK270 input to the gating signal generator 330, waveform (e) illustrates a first gating signal $S_{lin1}$ that switchably controls the first switch 123, waveform (f) illustrates a second gating signal $S_{lin2}$ that switchably controls the second switch 124, waveform (g) illustrates a third gating signal $S_{disch}$ that switchably controls the third switch 125, and waveform (h) illustrates different output voltage waveforms generated at the output node $V_{out}$ for different values of the variable currents $I_{lin1}$ and $I_{lin2}$ generated by the variable current sources 121 and 322, respectively.

As shown in FIG. 6, in a first quarter cycle (time period from $t_o$ to $t_1$), the first switch 123 is activated (closed) in response to a logic "high" gating signal $S_{lin1}$, while the second and third switches 124 and 125 are deactivated (opened) in response to logic "low" gating signals $S_{lin2}$ and $S_{disch}$, respectively. As such, in the first quarter cycle, a variable charging current $I_{lin1}$ generated by the first current source 121 is applied to charge the output capacitor 126, thereby creating a linearly varying output voltage on the output node $V_{out}$ at time $t_1$ that varies between 0 and $V_{mid}$, where $V_{mid}$ is a voltage level equal to or less than the switching threshold of the downstream inverter 127.

During the first quarter cycle (time period from $t_0$ to $t_1$) the capacitor 126 is charged only with $I_{lin1}$, while in a next half-cycle (time period from $t_1$ to $t_3$), both $I_{lin1}$ and $I_{lin2}$ are applied to charge the output capacitance $C_{out}$ of the output node $V_{out}$, effectively charging the capacitor 126 with a total current of $I_{max}$. In particular, in the next half-cycle (time period from $t_1$ to $t_3$), the first switch 123 remains activated (closed) in response to a logic "high" gating signal $S_{lin1}$, the second switch 124 is also activated (closed) in response to logic "high" gating signal $S_{lin2}$, and the third switch 125 remains deactivated (opened) in response to a logic "low" gating signal $S_{disch}$. As such, in the period from $t_1$ to $t_3$, a total current $I_{max}=I_{lin1}+I_{lin2}$ is applied to charge the output capacitor 126, such that the output voltage on node $V_{out}$ increases past the inverter threshold voltage level with a constant slope.

Next, in a final quarter cycle (time period from $t_3$ to $t_4$), the output capacitor is discharged by deactivating (opening) the first and second switches 123 and 124 and activating (closing) the third switch 125. In particular, in the time period from $t_3$ to $t_4$, the first and second switches 123 and 124 are deactivated (opened) in response to logic "low" gating signals $S_{lin1}$ and $S_{lin2}$, while the third switch 125 is activated (closed) in response to a logic "high" gating signal $S_{disch}$. As such, in the period from $t_3$ to $t_4$, neither variable current $I_{lin1}$ nor $I_{lin2}$ is applied to the output capacitor 126. Instead, the node $V_{out}$ is switchably connected to the second power supply node 129 (e.g., ground in this exemplary embodiment) to discharge the output capacitor 126 and reset the voltage on the output node $V_{out}$ to a voltage level of the second power supply node 129 in preparation for the arrival of the next rising edge of the gating signal $S_{lin1}$.

Figure 7:
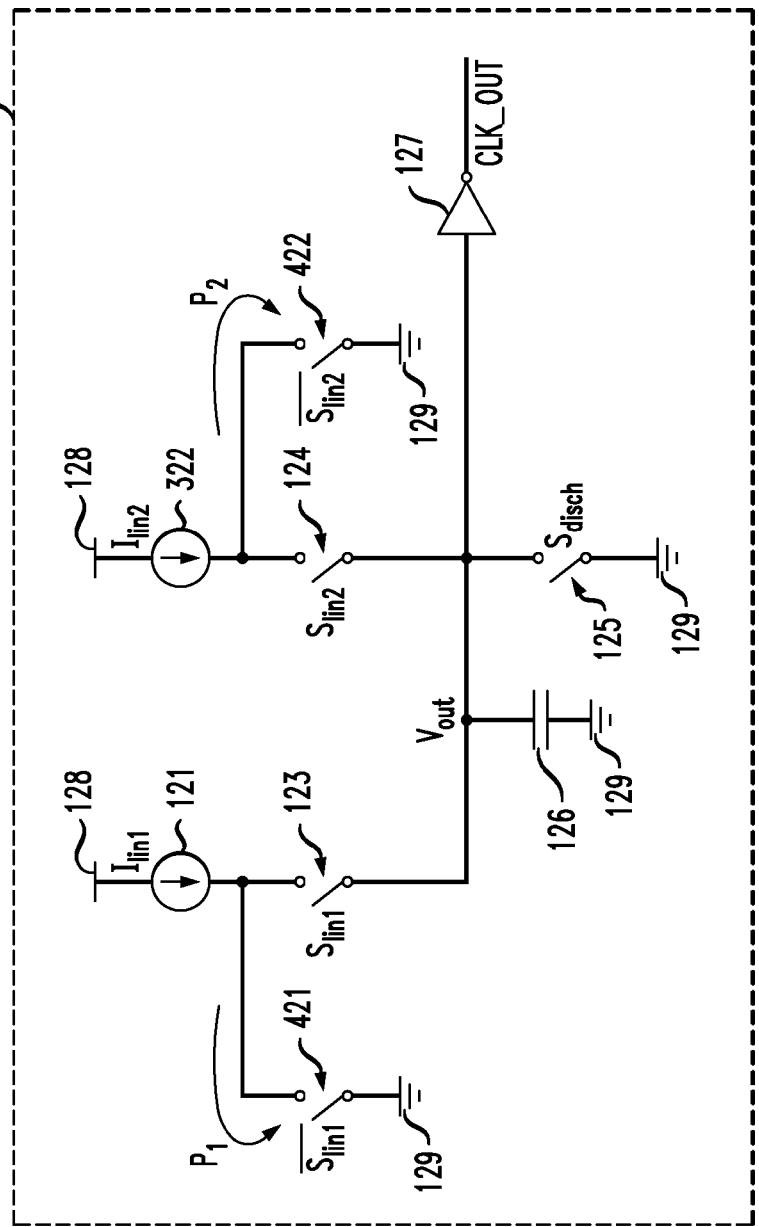
FIG. 7 is a schematic diagram of a phase interpolator circuit according to another exemplary embodiment of the invention.

In other exemplary embodiments of the invention, a phase interpolator may be implemented with additional current steering paths in the interpolator core to improve the linearity of the interpolation. For example, FIG. 7 is a schematic diagram of a phase interpolator circuit according to another embodiment of the invention, which implements current steering to improve the linearity of the interpolation. More specifically, FIG. 7 schematically depicts a phase interpolator 400 having an interpolator core 420 that is similar to the interpolator core 320 of the phase interpolator 300 of FIG. 5, except for the inclusion of additional current steering paths P1 and P2 comprising fourth and fifth switches 421 and 422. The fourth switch 421 (in path P1) is responsive to a control signal $\overline{S_{lin1}}$, which is the complement (inverse) of the control signal $S_{lin1}$ that controls the first switch 123. The fifth switch 422 (in path P2) is responsive to a control signal $\overline{S_{lin2}}$, which is the complement (inverse) of the control signal $S_{lin2}$ that controls the second switch 124.

In the exemplary embodiment of FIG. 7, the additional current steering paths P1 and P2 allow currents from the variable current sources 121 and 322 to be steered to the second power supply node 129 (ground in the example of FIG. 7) when the control signals $S_{lin1}$ and $S_{lin2}$ have logic levels that deactivate the first and second switches 123 and 124 and, thus, turn off the respective current branches in the interpolator core 420 for charging the output capacitor 126. It is to be appreciated that by providing a conduction path for the current sources 121 and 322 at all times irrespective of the phase of operation of the interpolator circuit, the transistors that form the current sources 121 and 322 are kept in saturation. This improves the linearity of the output clock phase versus control code transfer function by avoiding unwanted surges in the currents $I_{lin1}$ and $I_{lin2}$ that would otherwise introduce errors in the interpolation.

Figure 8:
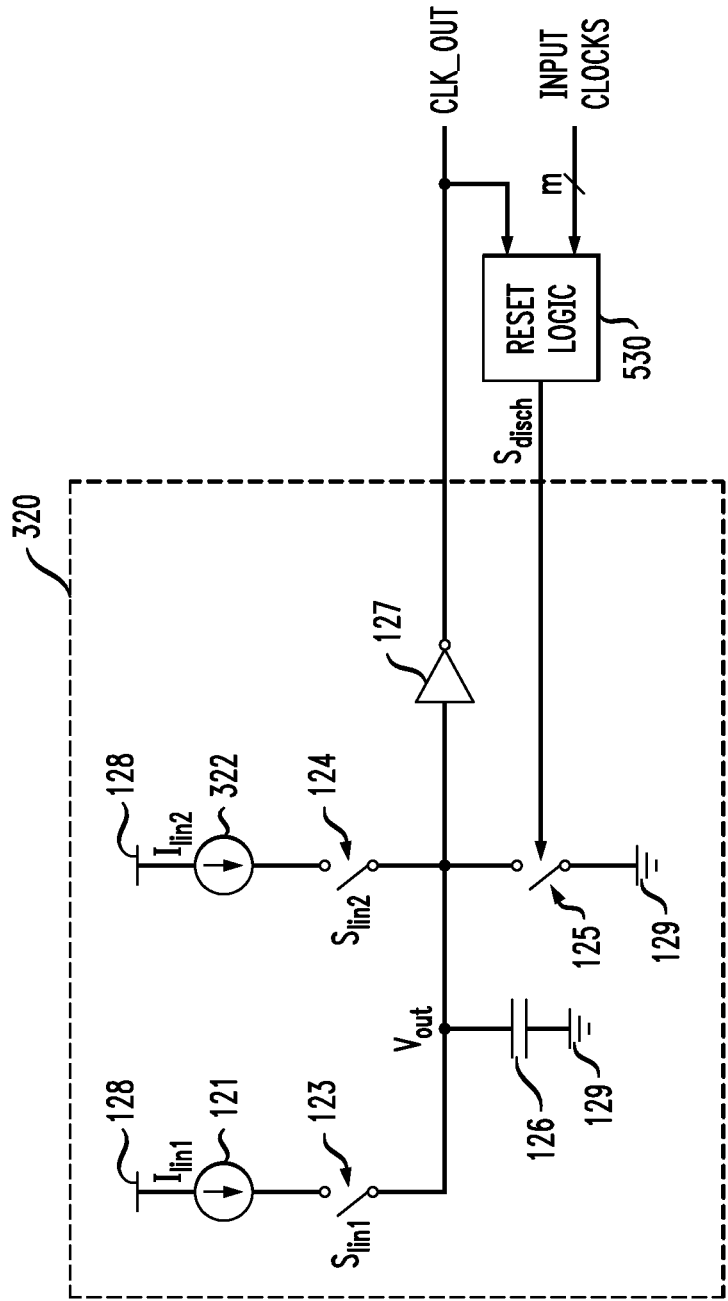
FIG. 8 is a schematic diagram of a phase interpolator circuit according to another exemplary embodiment of the invention.

In other embodiments of the invention, a separate reset circuit may be implemented to generate a control signal that is used to reset the output node $V_{out}$ in response to the output clock signal of a phase interpolator circuit. For instance, FIG. 8 is a schematic diagram of a phase interpolator circuit according to another embodiment of the invention, which implements self-resetting logic to reset the output node $V_{out}$. More specifically, FIG. 8 schematically depicts a phase interpolator circuit 500 that is similar to the phase interpolator circuit 300 of FIG. 5 with regard to the interpolator core 320 (with the current steering DAC 310 not shown in FIG. 8). The phase interpolator circuit 500 of FIG. 8 further includes a reset logic circuit 530 that receives the output clock signal CLK_OUT and a subset m of the input clocks to produce the $S_{disch}$ signal for resetting $V_{out}$. The reset logic circuit 530 is one exemplary embodiment of the gating signal generator 330 shown in FIG. 5 (or the gating signal generator 130 shown in FIG. 1), which receives as input a subset of the four quadrature clock input signals (CLK0, CLK90, CLK180, and CLK270) and the output clock signal to produce the gating signal $S_{disch}$.

The reset logic circuit 530 generates a trigger after the output clock CLK_OUT transitions, which occurs after $V_{out}$ has crossed the inverter threshold. Since the phase of the output clock CLK_OUT is determined by the timing of $V_{out}$ crossing the inverter threshold, the control code-to-phase transfer function of the interpolator is similar to that of other embodiments discussed above. By allowing the reset to occur as early as the reset circuit permits, more accurate resetting of the output node $V_{out}$ is possible.

Figure 9:
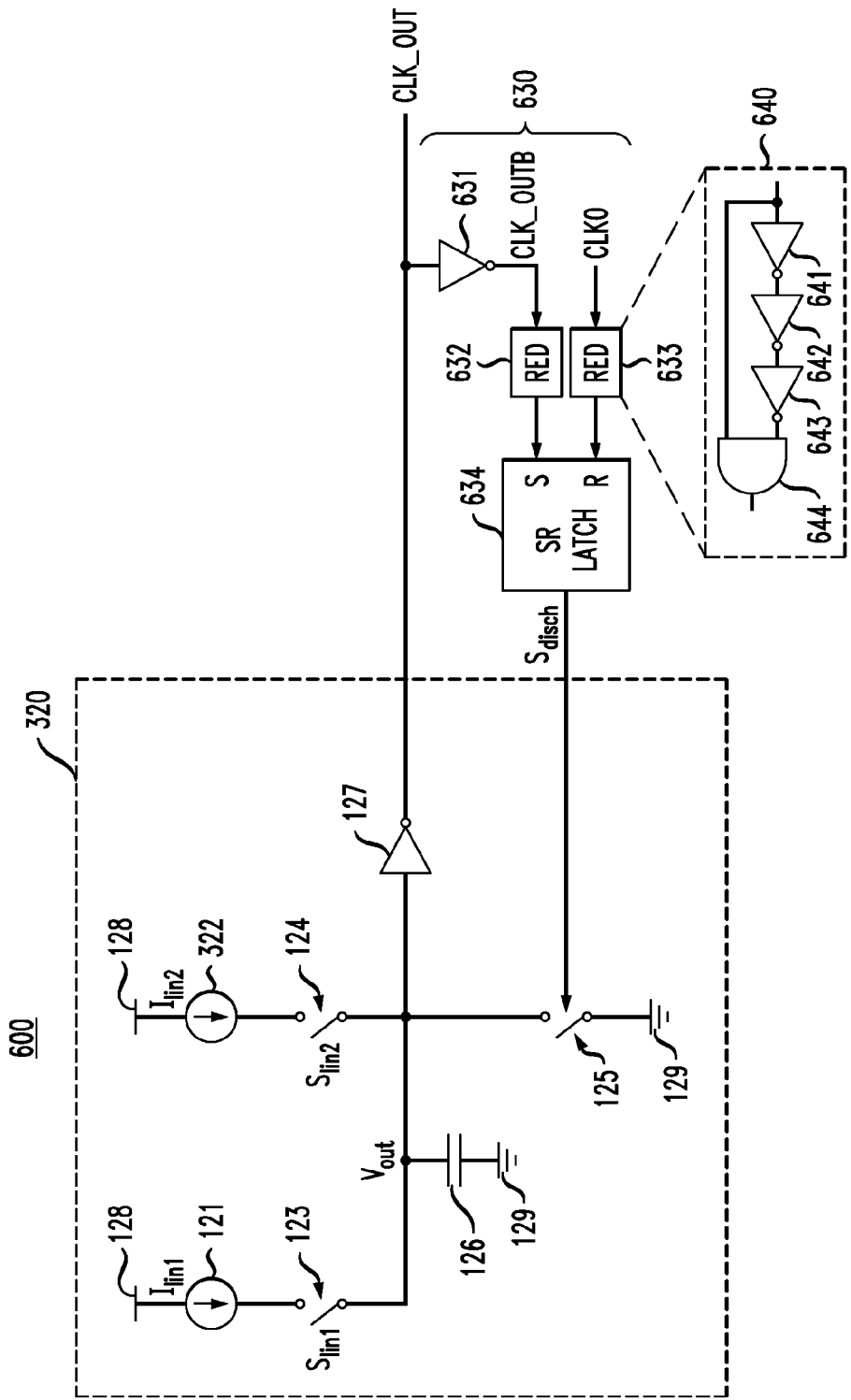
FIG. 9 is a schematic diagram of a phase interpolator circuit according to another exemplary embodiment of the invention.

FIG. 9 is a schematic diagram of a phase interpolator circuit according to another embodiment of the invention, which implements self-resetting logic to reset the output node $V_{out}$. More specifically, FIG. 9 schematically depicts a phase interpolator circuit 600 that is similar to the phase interpolator circuit 500 of FIG. 8, but showing an exemplary implementation of the reset logic circuit. In particular, a reset logic circuit 630 shown in FIG. 9 comprises an inverter 631, a first rising-edge detector (RED) circuit 632, a second RED circuit 633 and a set-reset (S-R) latch 634. The inverter 631 is connected between the second output node (CLK_OUT) and the input to the RED circuit 632. The inverter 631 inverts the output clock signal CLK_OUT and the RED circuit 632 receives as input a complementary output clock signal CLK_OUTB. The second RED circuit 633 receives as input the CLK0 signal. The rising edges of the CLK_OUTB and CLK0 signals are detected using the RED circuits 632 and 633, respectively. The outputs of the RED circuits 632 and 633 are connected to respective S and R inputs of the S-R latch 634 whose output is the $S_{disch}$ control signal that controls the third switch 125 for the interpolator core 320. As further shown in FIG. 9, each RED circuit 632 and 633 may be implemented by logic circuit 640. The logic circuit 640 comprises a series of inverters 641, 642, and 643, and an AND gate 644, the operation of which is readily understood by one of ordinary skill in the art.

Figure 10:
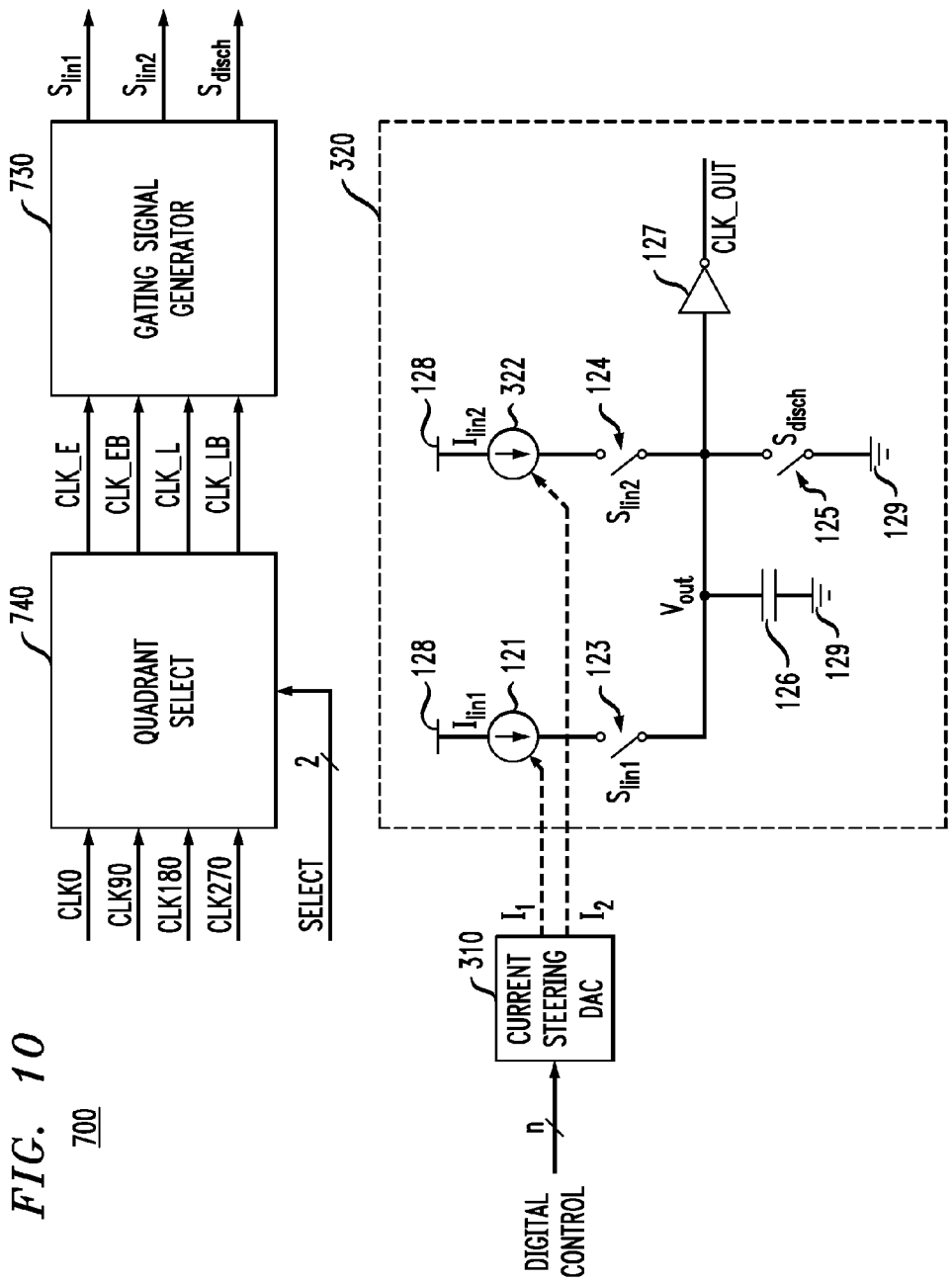
FIG. 10 is a schematic diagram of a phase interpolator circuit according to another exemplary embodiment of the invention providing four quadrant operation.

The exemplary embodiments of phase interpolator circuits 100, 200, 300, 400, 500 and 600 described above have a maximum phase adjustment range of a quarter clock cycle. However, many applications require phase interpolators that cover the entire clock cycle (for example, clock recovery circuits that need to accommodate cycle slipping). FIG. 10 is a schematic diagram of a phase interpolator circuit according to another embodiment of the invention providing four quadrant operation. In particular, FIG. 10 shows a CMOS phase interpolator circuit 700 comprising a current-steering DAC 310, an interpolating core 320 and a gating signal generator 730, which is similar to the phase interpolator circuit 300 of FIG. 5. In addition, the phase interpolator circuit 700 of FIG. 10 includes a quadrant selection circuit 740 at the front end of the phase interpolator circuit 700.

The quadrant selection circuit 740 receives as input four quadrature clock signals (CLK0, CLK90, CLK180 and CLK270), along with a 2-bit SELECT signal that determines the quadrant of operation for the phase interpolator 700. Depending on the SELECT signal, the output clocks of the quadrature selection circuit 740 (CLK_E and CLK_L) may be CLK0 and CLK90, or CLK90 and CLK180, or CLK180 and CLK270, or CLK270 and CLK0. CLK_EB and CLK_LB are the complements of CLK_E and CLK_L, respectively. Thus, the output clock phases of CLK_E and CLK_L are separated by a quarter clock cycle, and the interpolator acts upon these clock signals. In some embodiments, these output clocks are input to the gating signal generator 730 to provide three gating signals $S_{lin1}$, $S_{lin2}$, $S_{disch}$ as shown in FIG. 10. In other embodiments, the output clock phases of quadrature selection circuit 740 may be directly applied to an interpolator core designed in accordance with the exemplary embodiment of FIG. 3. The quadrant selection circuit 740 may be formed of multiplexer circuits, or other combinatorial logic gates.

Figure 11:
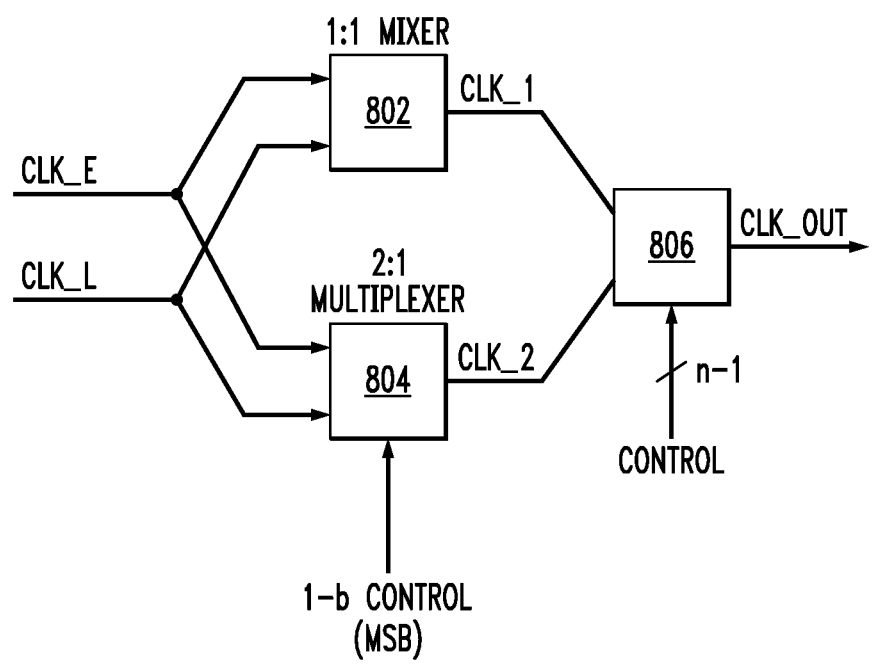
FIG. 11 is a block diagram of a phase interpolator circuit according to another exemplary embodiment of the invention wherein interpolation is performed in two stages.

In other exemplary embodiments of the invention, phase interpolation may be performed in multiple stages. FIG. 11 is a block diagram of a phase interpolator circuit according to another embodiment of the invention wherein interpolation is performed in two stages. In particular, FIG. 11 depicts a 2-stage phase interpolator 800 comprising a first phase interpolator 802, a second phase interpolator 804, and a third phase interpolator 806, wherein the phase interpolators 802, 804 and 806 may be implemented using any one of the exemplary phase interpolator embodiments described herein. The first and second phase interpolators 802 and 804 comprise the first stage of the multi-stage interpolator, and both receive as input two clock signals CLK_E and CLK_L that are phase-separated by a quarter clock cycle.

In the exemplary embodiment of FIG. 11, the phase interpolator circuit 802 is configured as a 1:1 mixer, implying that an output clock CLK_1 of the phase interpolator 802 has a phase (ignoring insertion delay) that is an average of the input clock phases. In the phase interpolator circuit 802, $I_{lin1}=I_{max}/$ 2, such that the two input clock phases are equally weighted by the interpolator 802. Moreover, the phase interpolator circuit 804 is configured as a 2:1 MUX, which selects either CLK_E or CLK_L based on a control bit, by setting either to $I_{max}$ or to zero. When $I_{lin1}=I_{max}$, the output clock CLK_2 is governed only by the CLK_E signal, and when $I_{lin1}=0$, CLK_2 is governed only by the CLK_L signal. Using the interpolator 804 as a 2:1 MUX ensures that the insertion delays of the two paths are equal. Thus, the output signals CLK_1 and CLK_2 of the respective interpolator circuits 802 and 804 are phase-separated by 45 degrees. The clocks CLK_1 and CLK_2 are input to the third phase interpolator circuit 806 (having (n−1) control bits), to produce the final output clock, CLK_OUT, with n-bits of phase resolution. In general, an m-stage n-bit phase interpolator may be implemented with (m−1) stages of mixers and multiplexers and a final stage interpolator with [n−(m−1)] bits of resolution. This allows finer resolution in the phase interpolator.

Figure 12:
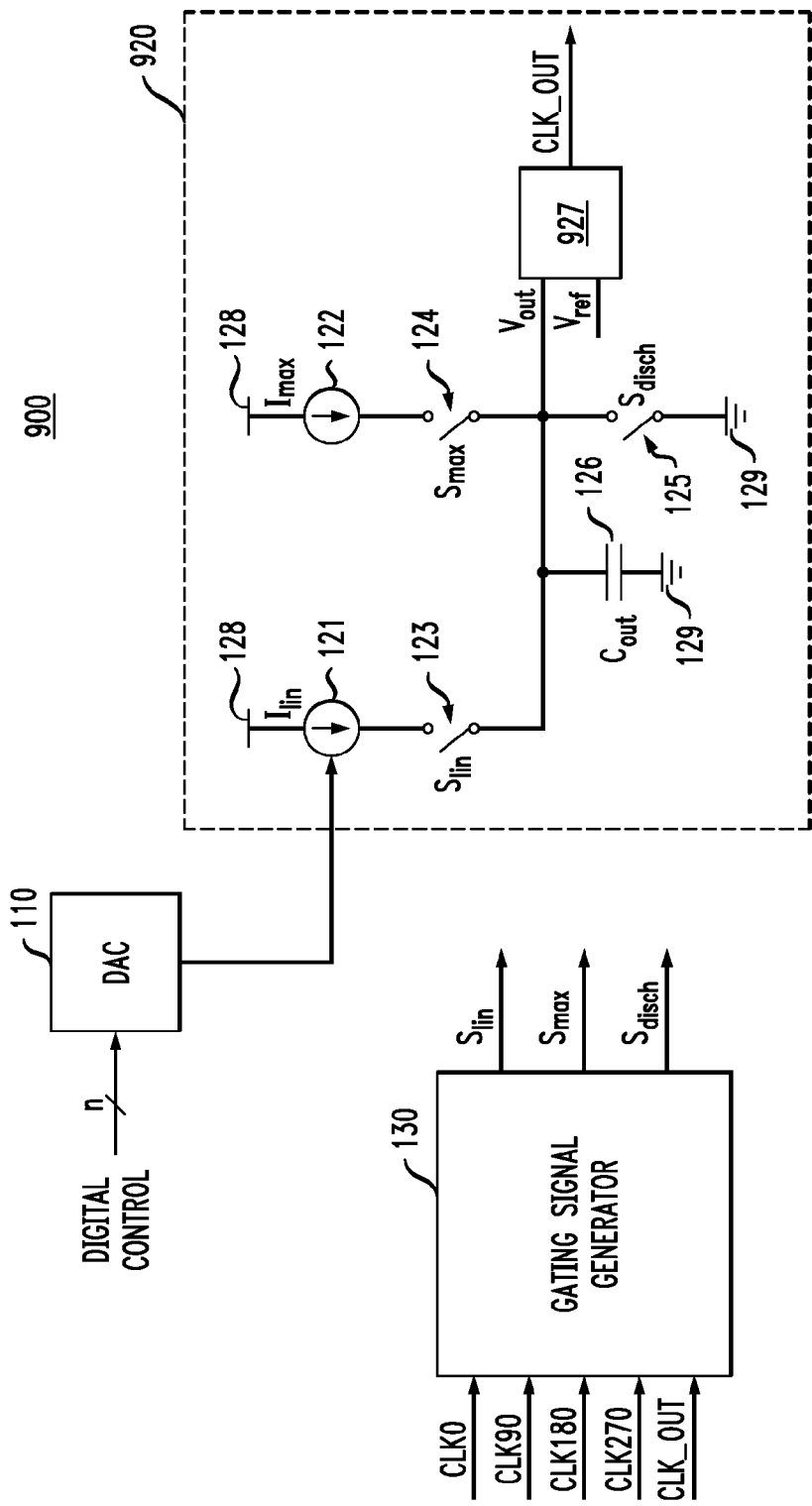
FIG. 12 is a schematic diagram of a phase interpolator circuit according to another exemplary embodiment of the invention.

Although the exemplary embodiments of FIGS. 1, 3, 5, 7, 8, 9, and 10, for example, illustrate the use of an inverter 127 in the interpolator core for generating the final output clock signal CLK_OUT, it is to be appreciated that any voltage-sensitive comparator circuit may be used for this purpose. For example, FIG. 12 is a schematic diagram of a phase interpolator circuit 900 according to another exemplary embodiment of the invention, which is similar to the phase interpolator circuit 100 shown in FIG. 1, for example, but wherein an interpolator core 920 shown in FIG. 12 employs a two-input voltage comparator circuit 927 (in place of the inverter 127 in the interpolator core 120 of FIG. 1). The voltage comparator circuit 927 has one input that is connected to the output node $V_{out}$ and a second input that is connected to a reference voltage $V_{ref}$. The operation of the phase interpolator circuit 900 of FIG. 12 is similar to the phase interpolator circuit 100 of FIG. 1 (as discussed with reference to the timing diagram of FIG. 2), wherein the reference voltage $V_{ref}$ sets the switching threshold of the voltage comparator circuit 927 and thereby plays a role similar to the switching threshold of the inverter 127.

While the embodiments of the invention as described herein have been shown to have $V_{out}$ reset to the low supply voltage or ground voltage, the principles of the invention are equally applicable to embodiments where $V_{out}$ is reset to the high supply voltage. In this case, however the current sources will be of opposite polarity, sinking current instead of sourcing current. Other straightforward modifications and variations of the disclosed embodiments, such as changing NMOS transistors to PMOS types, and vice versa, will be obvious to those skilled in the art. Such modifications and variations do not depart from the spirit and scope of the invention.

Further aspects of the present invention provide phase interpolator circuits which can be utilized in integrated circuit chips with various analog and digital integrated circuitries. In particular, integrated circuit dies can be fabricated having phase interpolator circuits and other semiconductor devices such as field-effect transistors, bipolar transistors, metal-oxide-semiconductor transistors, diodes, resistors, capacitors, inductors, etc., forming analog and/or digital circuits. The phase interpolator circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g.; cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for generating a clock signal by interpolating between a phase of a first input clock signal and a phase of a second input clock signal, wherein the phase of the first input clock signal is earlier than the phase of the second input clock signal, the method comprising:

detecting an arrival of an edge of the first input clock signal;

in response to said detecting, switchably connecting a first current source to an output node to apply a first current to the output node and charge a capacitance of the output node, using only the first current, to a voltage level which is less than or equal to a switching threshold of a voltage comparator circuit;

detecting an arrival of an edge of the second input clock signal;

in response to said detecting, switchably connecting a second current source to the output node to apply a second current to the output node and charge the capacitance of the output node to a voltage level which exceeds the switching threshold of the voltage comparator circuit; and controlling the first current source to generate a first current having a variable magnitude that is selected to adjust a timing at which the capacitance on the output node is charged to a voltage level that exceeds the switching threshold of the voltage comparator circuit and thereby adjust a phase shift of the output clock signal output from the voltage comparator circuit.

2. The method of claim 1, wherein in response to detecting the arrival of an edge of the second input clock signal, the method further comprises switchably disconnecting the first current source from the output node such that only the second current is applied to charge the capacitance on the output node to a voltage level that exceeds the switching threshold of the voltage comparator circuit.

3. The method of claim 1, wherein the second current is a fixed current.

4. The method of claim 1, wherein the first and second input clock signals are CMOS rail-to-rail signals and wherein the output clock signal is substantially a CMOS rail-to-rail signal.

5. The method of claim 1, wherein in response to detecting the arrival of an edge of the second input clock signal, the method further comprises maintaining the first current source connected to the output node such that the first and second currents are applied to charge the capacitance on the output node to a voltage level that exceeds the switching threshold of the voltage comparator circuit.

6. The method of claim 5, further comprising controlling the first and second current sources to generate the first and second currents such that a sum of the first and second currents equals a predefined maximum current.

7. The method of claim 1, further comprising resetting a voltage level of the output node to a voltage level of a power supply node, during a reset phase.

8. The method of claim 7, wherein the power supply node is at a ground voltage level.

9. The method of claim 7, wherein resetting comprises resetting a voltage level on the output node in response to a reset control signal that is generated at least in part in response to a detection of a rising edge or falling edge of the output clock signal.

10. The method of claim 1, wherein the voltage comparator circuit is an inverter circuit.

11. The method of claim 1, wherein the voltage comparator circuit is a two-input voltage comparator circuit having a first input connected to the output node and a second input connected to a reference voltage, wherein the method comprises comparing the voltage on the output node with the reference voltage to generate the output clock signal.

12. The method of claim 1, wherein the capacitance of the output node comprises a discrete capacitor element that is connected between the output node and a power supply node.

13. The method of claim 1, wherein the capacitance of the output node comprises a parasitic capacitance.

14. The method of claim 1, wherein the first current source is controlled by a current DAC (digital-to-analog converter) circuit.

15. A method for generating a clock signal by interpolating between a phase of a first input clock signal and a phase of a second input clock signal, wherein the phase of the first input clock signal is earlier than the phase of the second input clock signal, the method comprising:

generating a first output clock signal by interpolating between the phases of the first and second input clock signals using a first interpolation circuit;

generating a second output clock signal by interpolating between the phases of the first and second input clock signals using a second interpolation circuit; and generating a third output clock signal by interpolating between phases of the first and second output clock signals using a third interpolation circuit wherein at least one of generating the first output clock signal and generating the second output clock signal comprises:

detecting an arrival of an edge of the first input clock signal;

in response to said detecting, switchably connecting a first current source to an output node to apply a first current to the output node and charge a capacitance of the output node, using only the first current, to a voltage level which is less than or equal to a switching threshold of a voltage comparator circuit;

detecting an arrival of an edge of the second input clock signal;

in response to said detecting, switchably connecting a second current source to the output node to apply a second current to the output node and charge the capacitance of the output node to a voltage level which exceeds the switching threshold of the voltage comparator circuit; and controlling the first current source to generate a first current having a variable magnitude that is selected to adjust a timing at which the capacitance on the output node is charged to a voltage level that exceeds the switching threshold of the voltage comparator circuit and thereby adjust a phase shift of the output clock signal output from the voltage comparator circuit.

* * * * *